United States Patent [19]

Lee

[11] Patent Number: 5,753,549
[45] Date of Patent: May 19, 1998

[54] METHOD FOR FABRICATING CAPACITOR OF SEMICONDUCTOR DEVICE

[75] Inventor: Young Jong Lee, Daejon, Rep. of Korea

[73] Assignee: LG Semicon Co., Ltd., Cheongju, Rep. of Korea

[21] Appl. No.: 772,984

[22] Filed: Dec. 23, 1996

[30] Foreign Application Priority Data

Dec. 30, 1995 [KR] Rep. of Korea ............... 68657/1995

[51] Int. Cl.⁶ ............................................... H01L 21/8242
[52] U.S. Cl. ........................... 438/243; 438/386; 438/424
[58] Field of Search ......................... 437/52, 60, 67, 437/203, 919; 148/DIG. 50, DIG. 14; 438/243, 386, 424

[56] References Cited

U.S. PATENT DOCUMENTS

| | | | |
|---|---|---|---|
| 4,577,395 | 3/1986 | Shibata | 437/52 |
| 5,106,774 | 4/1992 | Hieda et al. | 437/52 |
| 5,272,102 | 12/1993 | Hur et al. | 437/52 |
| 5,346,845 | 9/1994 | Jun | 437/52 |
| 5,466,628 | 11/1995 | Lee et al. | 437/60 |

FOREIGN PATENT DOCUMENTS

63-86560  4/1988  Japan ........................... 437/67

*Primary Examiner*—Charles L. Bowers, Jr.
*Assistant Examiner*—Toniae M. Thomas
*Attorney, Agent, or Firm*—Fleshner & Kim

[57] ABSTRACT

A method for fabricating a capacitor of a semiconductor device which is capable of reducing data errors caused due to the interaction between neighboring capacitors, which includes the steps of forming a first trench in a semiconductor substrate, filling the first trench with an insulation film, etching the semiconductor substrate at both sides of the first trench for forming second and third trenches, forming a first electrode at both sides of the second and third trenches, respectively, forming a dielectric film on the first electrode and the second and third trenches, and forming a second electrode on the dielectric film.

10 Claims, 13 Drawing Sheets

METHOD FOR FABRICATING CAPACITOR OF SEMICONDUCTOR DEVICE

BACKGROUND OF THE INVENTION

1. Field of the Invention

The present invention relates to a method for fabricating a capacitor of a semiconductor device, and particularly to an improved method for fabricating a capacitor of a semiconductor device by which it is possible to obtain a trench-to-trench isolation and form a plate electrode of a trench capacitor of which its formation position is changed compared to the conventional formation position.

2. Description of the Conventional Art

In the industry, the scaling down of an integrated circuit is important for a dynamic random access memory (DRAM). In the DRAM, a memory cell includes a transistor and a capacitor. The space which one cell occupies is decreased with higher integration of the memory device. As the size of the cell is reduced, it is possible to decrease the voltage directed to driving the cell. However, there is a limitation in decreasing the capacitance in a capacitor irrespective of its integration limit for the reasons that there is a high possibility of leaking stored charged at the periphery of the capacitor, and it is impossible to sense the leakage of the change since the influence of a soft error caused by α-particles is relatively increased. The minimum capacitance of a capacitor in a DRAM is about 25–30 fF.

As the size of the cell is gradually decreased, the area in which the cell occupies is reduced thereby, so it is important to increase the dielectric constant $\epsilon_r$ of a dielectric thin film. Generally, in accordance with the silicon fabrication process, the most compatible dielectric thin film is made of $SiO_2$. However, the dielectric constant of $SiO_2$ is about 3.8. In addition, since there is a limit in decreasing the thickness of the dielectric thin film, $SiO_2$ is not exclusively used, so $SiO_2$ is used for forming an oxide-nitride-oxide thin film and a nitride-oxide thin film. However, the effective thickness of the currently used nitride-oxide thin film is about 4 nm even though it is processed through a nitridation anneal. Therefore, in the case of forming the capacitor using the nitride-oxide layer having an effective thickness limit, since it is impossible to secure a desired capacitance higher than its minimum limit when using a planar type capacitor, it is necessary to form the capacitor in three dimensions by vertically and downwardly digging into the surface of the substrate.

Figure 1:
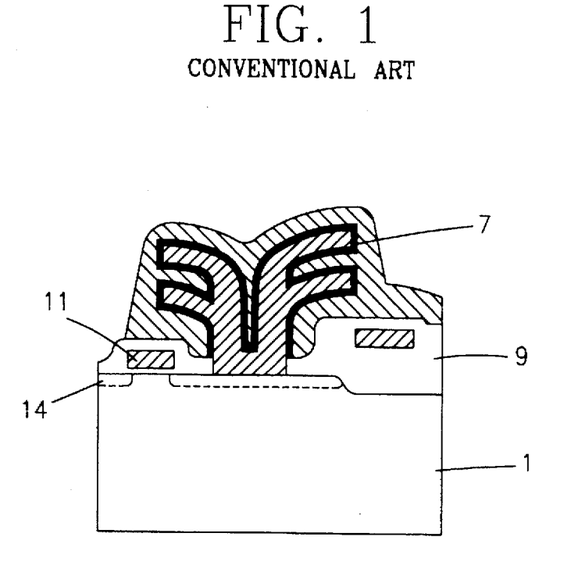
FIG. 1 is a cross-sectional view illustrating the construction of a conventional semiconductor device having a fin type capacitor.
Figure 2:
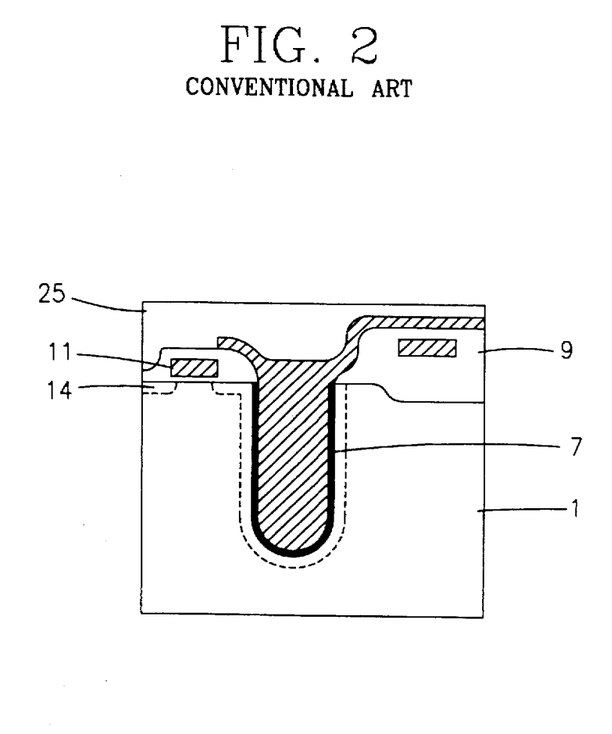
FIG. 2 is a cross-sectional view illustrating the construction of a conventional semiconductor device having a trench capacitor structure.

FIGS. 1 and 2 are cross-sectional views illustrating the semiconductor device having a three dimensional capacitor structure. FIG. 1 illustrates a stacked capacitor having a finned structure. With this structure, it is possible to obtain a desired capacitance by increasing the number of fins. However, the above-mentioned structure has a disadvantage in that a topology is formed in the cell or between the cells, and a global topography is caused in a cell area and at the periphery in which the capacitor is not formed, thus complicating the next succeeding process after the capacitor is formed. Namely, a stacked capacitor having a higher height is required when forming the cells in a capacitor over bit line (COB) arrangement. In accordance with the COB structure, a bit line is first formed before the capacitor is formed, and an interlayer dielectric layer is formed for insulating a metal line through a planarization process. In addition, since a contact hole is open during the metallization process with respect to the bit line and the silicon substrate, it is required to fill two kinds of contact holes at the same time, for thus more complicating succeeding processes.

FIG. 2 is a cross-sectional view illustrating a semiconductor device having a conventional trench capacitor structure. In the conventional trench capacitor structure, there is no topology formation problem caused due to the formation of the capacitor; however, in order to secure an effective capacitor area, the depth of the trench must be made deep, whereby the formation process of a silicon thin film which is used as the electrode during the trench etching process, and a trench cleaning process become complicated. In addition, since the trench capacitor has a wider area contacting with the silicon substrate, the possibility of the occurrence of soft errors due to α-particles is higher compared to the stacked capacitor cell as shown in FIG. 1.

Figure 3A:
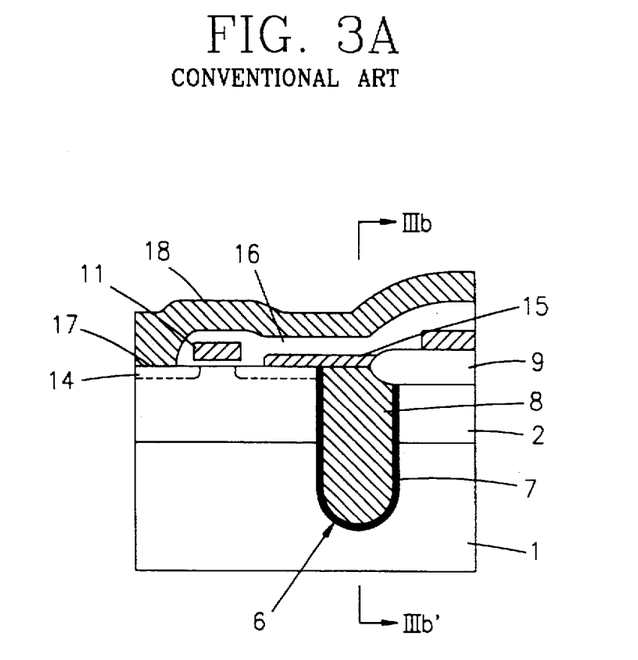
FIGS. 3A and 3B are cross-sectional views illustrating another conventional semiconductor device having a trench capacitor structure.
Figure 3B:
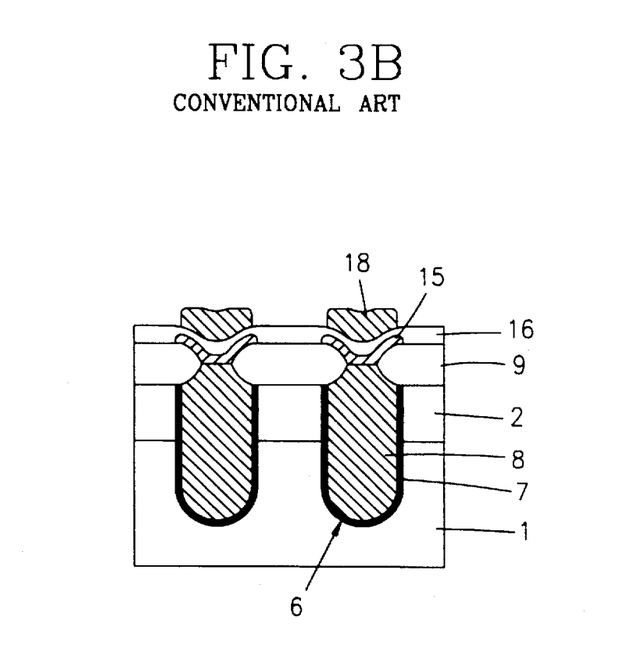

FIGS. 3A and 3B are cross-sectional views illustrating a semiconductor device having the conventional trench capacitor structure. As shown therein, the semiconductor substrate 1 acts as the plate electrode of the capacitor at the periphery of the trench 6, and the trench plug 8 filled in the trench 6 becomes a storage node. In this case, there may be a soft error reduction effect which is caused due to α-particles as shown in FIG. 2. The leakage current is induced along the boundary surface between a thin dielectric of a P-type well 2 and the silicon substrate. FIG. 3B is a cross-sectional view taken along line IIIb–IIIb' of FIG. 3A illustrating the trench capacitor. In the above-mentioned trench capacitor, there can occur an interaction between adjacent capacitors, thus causing an error.

The fabrication method of the semiconductor device of the conventional trench capacitor structure will now be explained with reference to FIGS. 3 and 4.

Figure 4A:
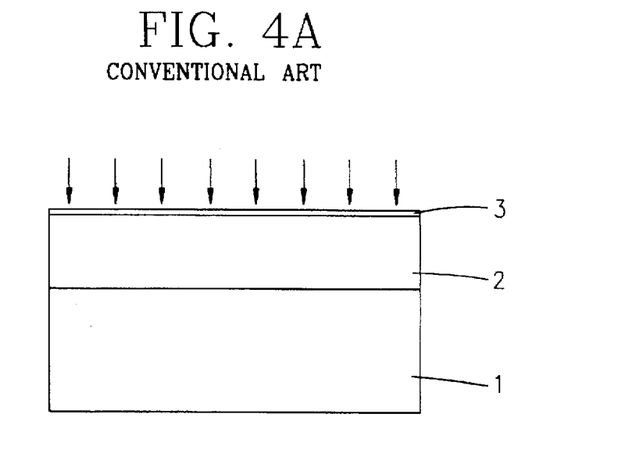
FIGS. 4A through 4H are cross-sectional views illustrating a fabrication process of the conventional semiconductor device having a trench capacitor structure of FIG. 3.

First, in the processes as shown in FIG. 4A, an ion implantation of $BF_2$ is performed into the semiconductor substrate 1, and a P-well is formed through an annealing process directed to driving-in Boron. A buffer oxidation layer 3 is formed prior to the ion implantation process so as to prevent a damage to the semiconductor substrate 1. The buffer 3 is substantially stripped after the drive-in process.

Figure 4B:
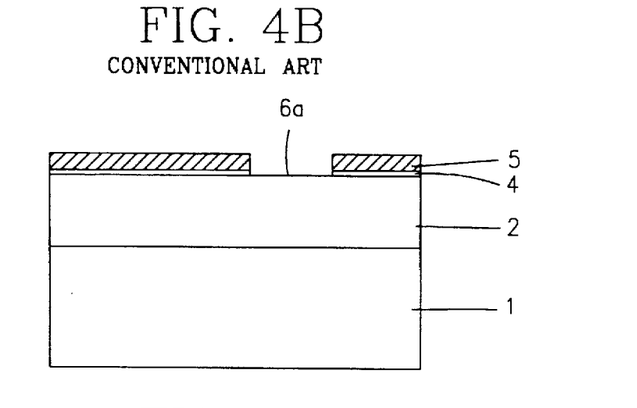

In the processes as shown in FIG. 4B, a pad oxidation layer 4 is formed on the semiconductor substrate 1, and a nitride film ($Si_3N_4$) is formed to a predetermined thickness by a chemical vapor deposition (CVD) process, and a portion 6a in which a trench is to be formed is defined through a photolithography process, for thus exposing the substrate 1.

Figure 4C:
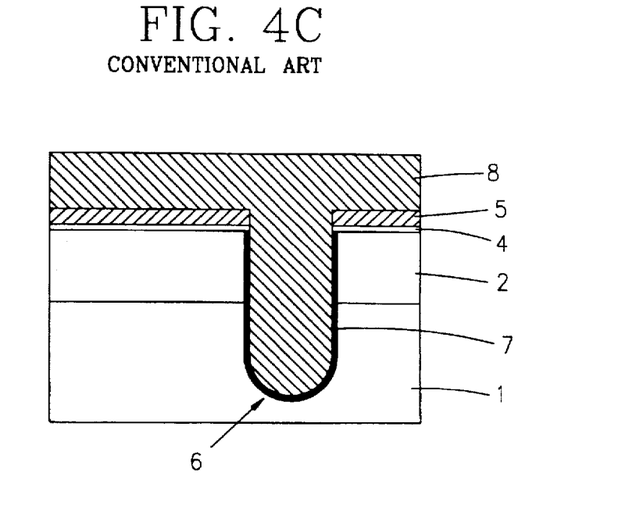

In the processes as shown in FIG. 4C, the exposed substrate 1 is etched by a dry etching process is etched so as to form a trench 6, and a dielectric thin layer 7 is formed on the surface of the trench 6, and a doped polysilicon 8 which is to be a storage node is formed on the substrate 1 including the trench 6.

Figure 4D:
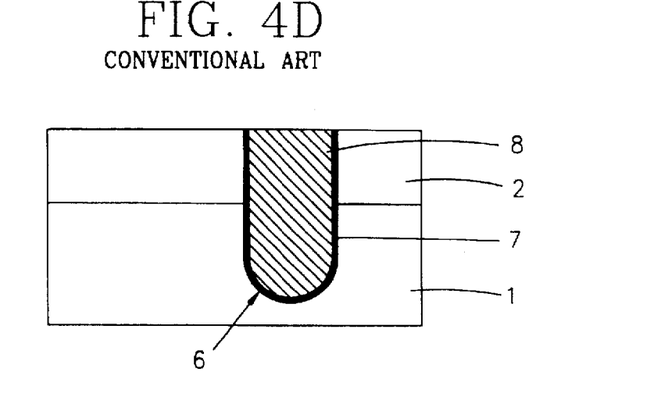

In the processes as shown in FIG. 4D, the doped polysilicon 8 formed on the upper portion of the trench 6 is removed by an anisotropic dry etching, and the nitride film ($Si_3N_4$) and the pad oxidation layer 4 are substantially stripped by a dry etching or wet etching, for thus leaving the doped polysilicon 8 in the trench 6, and thus a capacitor storage electrode is formed.

Figure 4E:
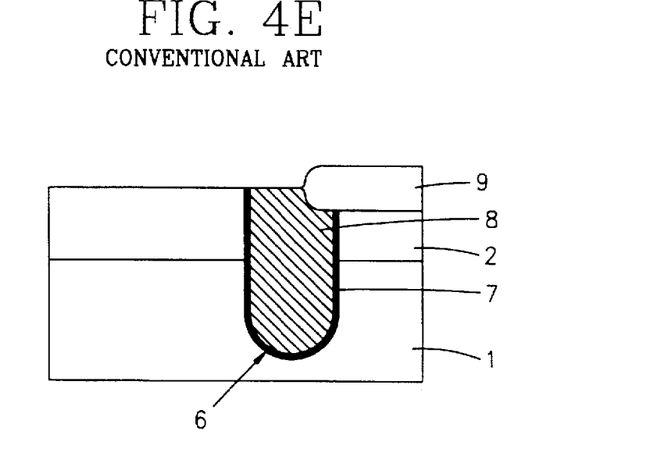

In the processes as shown in FIG. 4E, an active region and a field region are defined on the substrate 1 by the commonly known local oxidation of silicon (LOCOS) method or the modified LOCOS method, for thus forming a field oxidation film 9 in the field region.

Figure 4F:
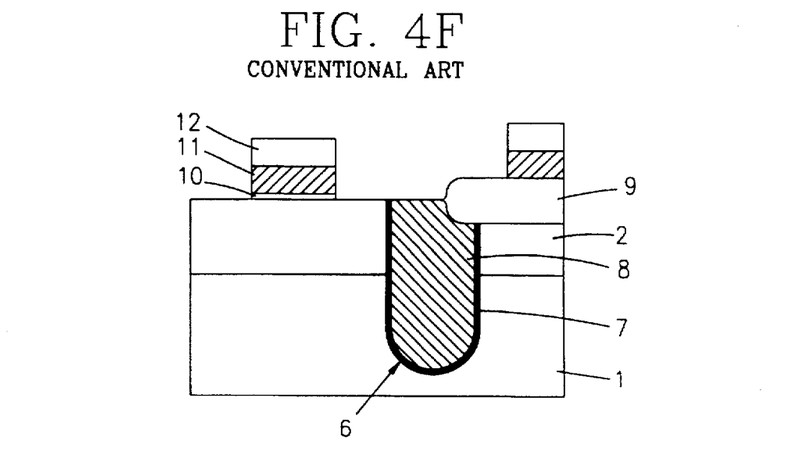

In the processes as shown in FIG. 4F, a gate oxidation layer 10 is formed to a predetermined thickness in a predetermined region of the semiconductor substrate 1, a polysilicon layer 11 and an oxidation film 12 are sequentially formed on the surface of the semiconductor substrate 1, and the oxidation film 12, the polysilicon layer 11, and the gate oxidation layer 10 are defined at the same time through a photolithography process and then etched. During the above-described processes, the oxidation film 12 acts as a cap of the gate electrode.

Figure 4G:
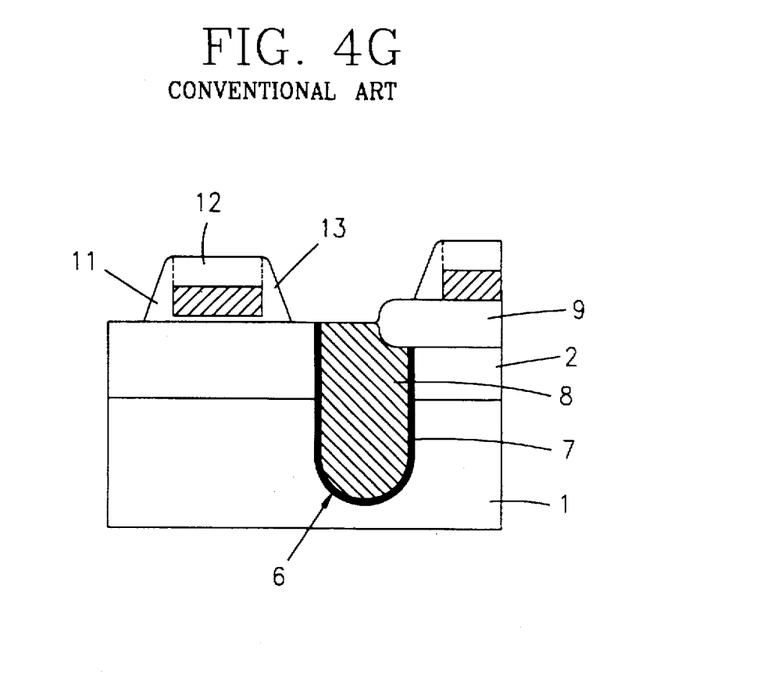

In the processes as shown in FIG. 4G, an oxidation film 13 is formed on the surface of the substrate 1 by a CVD process, and the gate polysilicon layer 11 is encapsulated by an anisotropic dry etching.

Figure 4H:
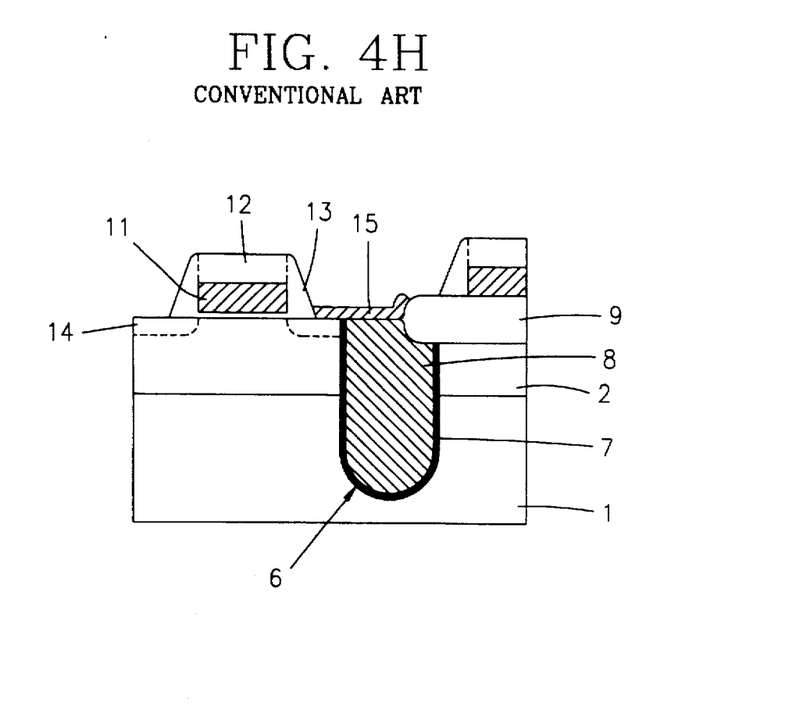

In the processes as shown in FIG. 4H, an n+ diffusion region 14 is formed at both sides of the gate electrode by an n-type ion implantation which is directed to forming source/drain regions in the exposed region of the semiconductor substrate 1. Thereafter, a doped polysilicon layer 15 is deposited by a CVD process for electrically connecting the storage node of the capacitor and the n+ diffusion region 14. Thereafter, the storage node of the capacitor, the n+ diffusion region 14, and the doped polysilicon layer 15 are defined through a photolithography process.

As shown in FIG. 3A, an interlayer dielectric layer 16 is formed on the semiconductor substrate 1 on which the capacitor is formed so as to insulate between the metal line 18 and the doped polysilicon layer 15. A contact region 17 is opened, and a conductive layer 18 is formed and is electrically connected with the contact region 17, for thus forming a semiconductor device having the conventional trench capacitor structure.

As described above, in the semiconductor device having the conventional trench capacitor structure, since the substantial isolation between the trench regions is not made, there is a disadvantage in that errors may occur in the stored information due to interaction between neighboring capacitors. In addition, since the polysilicon layer 8 filled in the trench region 6 becomes a storage node, the current is leaked at the boundary surface between the dielectric thin film 7 of the P-well 2 and the silicon substrate, for thus degrading the reliability of the semiconductor device.

SUMMARY OF THE INVENTION

Accordingly, it is an object of the present invention to provide a method for fabricating a capacitor of a semiconductor device which overcomes the problems encountered in the conventional method for fabricating a capacitor of a semiconductor device.

It is another object of the present invention to provide an improved method for fabricating a capacitor of a semiconductor device which is capable of reducing errors in stored data caused due to the interaction between neighboring capacitors.

It is still another object of the present invention to provide an improved method for fabricating a capacitor of a semiconductor device which is capable of reducing the leakage current leaked at a boundary surface of the semiconductor substrate by changing a formation position of a plate electrode of the capacitor in a trench region.

To achieve the above objects, in accordance with a first embodiment of the present invention, there is provided a method for fabricating a capacitor of a semiconductor device which includes forming a first trench in a semiconductor substrate, filling the first trench with an insulation film, etching the semiconductor substrate at both sides of the first trench and for forming second and third trenches, forming a first electrode at both sides of the second and third trenches, respectively, forming a dielectric film on the first electrode and the second and third trenches, and forming a second electrode on the dielectric film.

To achieve the above objects, in accordance with a second embodiment of the present invention, there is provided a method for fabricating a capacitor of a semiconductor device which includes forming a first trench in a semiconductor substrate, filling an insulation film in the first trench, forming a gate electrode on the semiconductor substrate at both sides of the first trench, forming impurity region in the semiconductor substrate at both sides of the gate electrode, etching the impurity region at both sides of the first trench and forming second and third trenches, forming a first electrode at both sides of the second and third trenches, forming a dielectric film at the first electrode and the second and third trenches and forming a second electrode on the dielectric film, and forming impurity region neighboring with the second and third trenches and a conductive layer on the second electrode.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 5A:
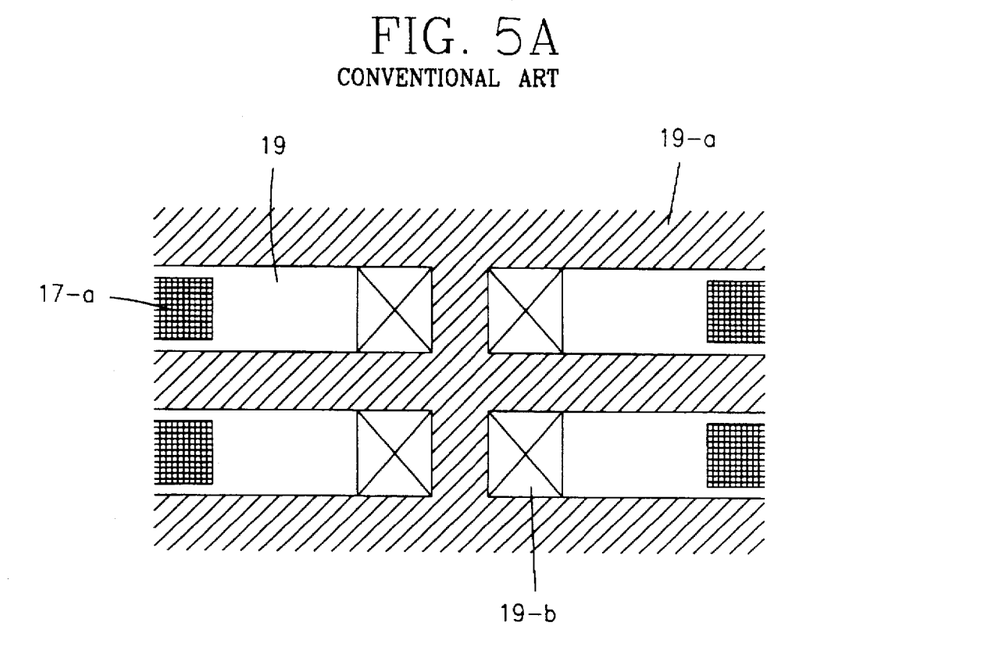
FIGS. 5A and 5B are plan views illustrating the layout of a memory cell of a trench capacitor according to the present invention.
Figure 5B:
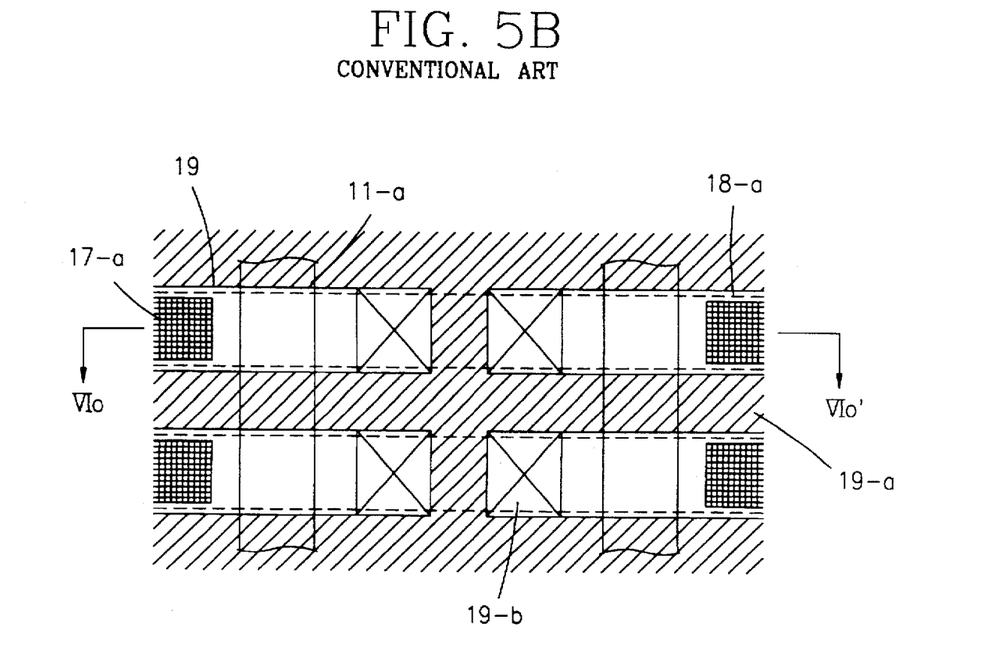

FIGS. 5A and 5B are plan views illustrating the layout of a memory cell having a trench capacitor according to the present invention. As shown therein, there is formed an active region 19. A field region 19-a encapsulates the active region 19. Second and third trenches 19b and a metal contact region 17-a are formed. As shown in FIG. 5B, a bit line 18-a is formed. In the drawings, reference numeral 11-a denotes a word line intersecting with another bit line 18-a.

The capacitor fabrication method of a semiconductor device according to the present invention will now be explained with reference to FIGS. 6A through 6O.

Figure 6A:
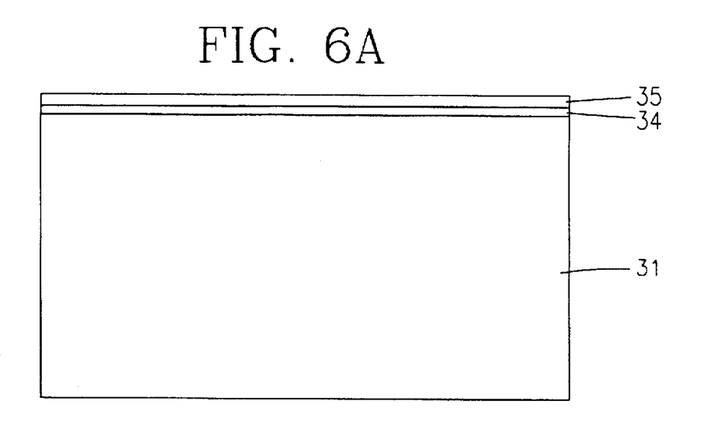
FIGS. 6A through 6O are cross-sectional views illustrating a fabrication process of a capacitor of a semiconductor device according to the present invention.

First, in the processes as shown in FIG. 6A, a pad oxide film 34 is formed on a semiconductor substrate 31 by a thermal oxidation process, and a nitride film ($Si_3N_4$) 35 which is used as a blocking film is then formed thereon by a CVD process.

Preferably, the pad oxide film 34 is formed to a thickness of about 20–150 nm, and the nitride film ($Si_3N_4$) 35 is formed to a thickness of about 100–300 nm.

Figure 6B:
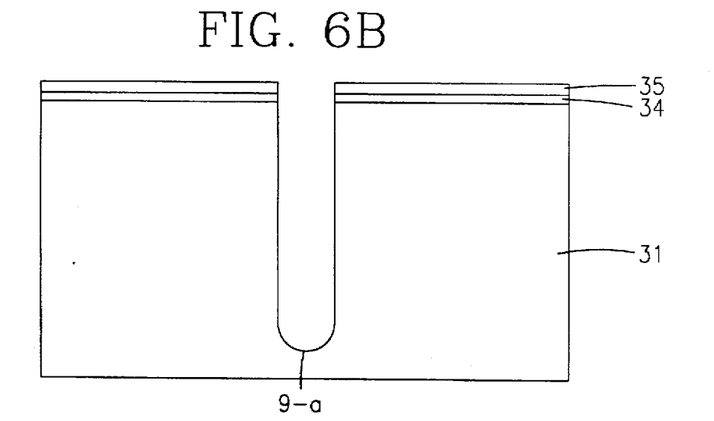

In the processes as shown in FIG. 6B, a trench isolation region (namely, a field region) is defined on the semiconductor substrate 31 by a thermal oxidation process.

In addition, the trench isolation region (namely, the field region) is defined in the nitride film 35 through a photolithography process, and the nitride film 35 and the pad oxidation film 34 are sequentially removed by a dry etching process, and a first trench 9-a is formed in the semiconductor substrate 31 by a trench etching method.

Figure 6C:
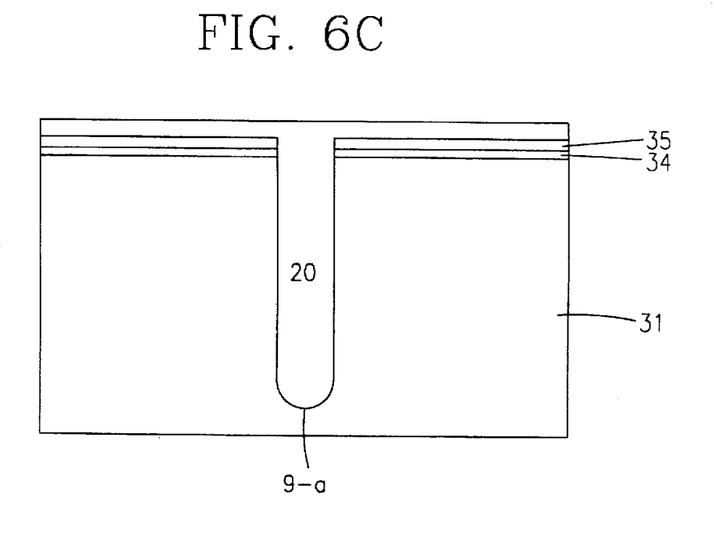

In the processes as shown in FIG. 6C, a first CVD oxide film 20 having an excellent step coverage characteristic for filling the first trench 9-a is deposited on the semiconductor substrate 31 by a CVD. Here, the interior of the first trench 9-a may be filled with either a high temperature oxide (HTO) material, or a high temperature low pressure dielectric (HLD) material, or a spin-on glass (SOG) having a lower moisture and lower stress level.

Figure 6D:
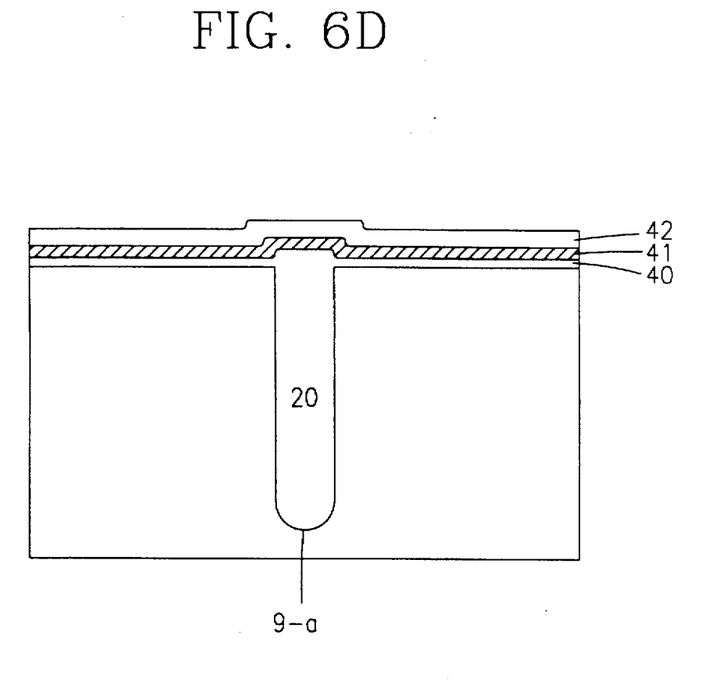

In the processes as shown in FIG. 6D, the first CVD oxide film 20 is etched-back until the nitride film 35 is exposed. The first CVD oxide film 20 which is an insulation film is filled in the first trench 9-a by the etching process. The nitride film 35 is removed by a wet strip process, and the pad oxide film 34 is removed. Thereafter, a gate oxide film 40, a doped polysilicon 41 which acts as the gate electrode, and a cap oxide film 42 are sequentially formed on a predetermined portion of the semiconductor substrate 31 including the first CVD oxide film 20. Here, the doped polysilicon 41 and the cap oxide film 42 are formed by CVD, and the doping method of the polysilicon is classified into a method of using $POCL_3$ and an in-situ doping method of using $SiH_4(SiH_6)$—$PH_3$. In the oxide film etching process, both the dry and wet etching methods may be used, or a chemical mechanical polishing (CMP) method may be used. In any case, since the nitride film 35 acts as an etching stop layer, the fabrication process is made easier.

Figure 6E:
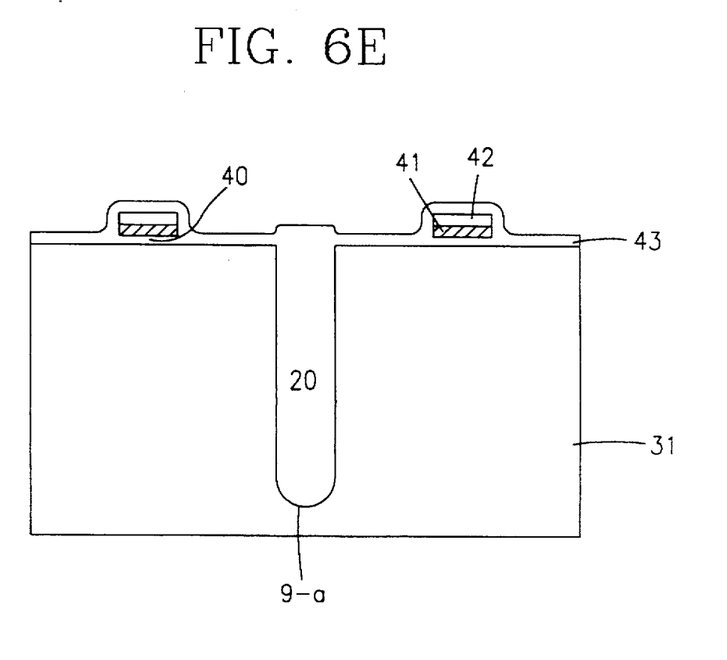

In the processes as shown in FIG. 6E, in order to form the gate electrode, the cap oxide film 42, the doped polysilicon 41, and the gate oxidation film 40 are sequentially defined through a photolithography process, and then are etched. Thereafter, a second CVD oxide film 43 is formed on the semiconductor substrate 31 including the cap oxide film 42 by a CVD process.

Figure 6F:
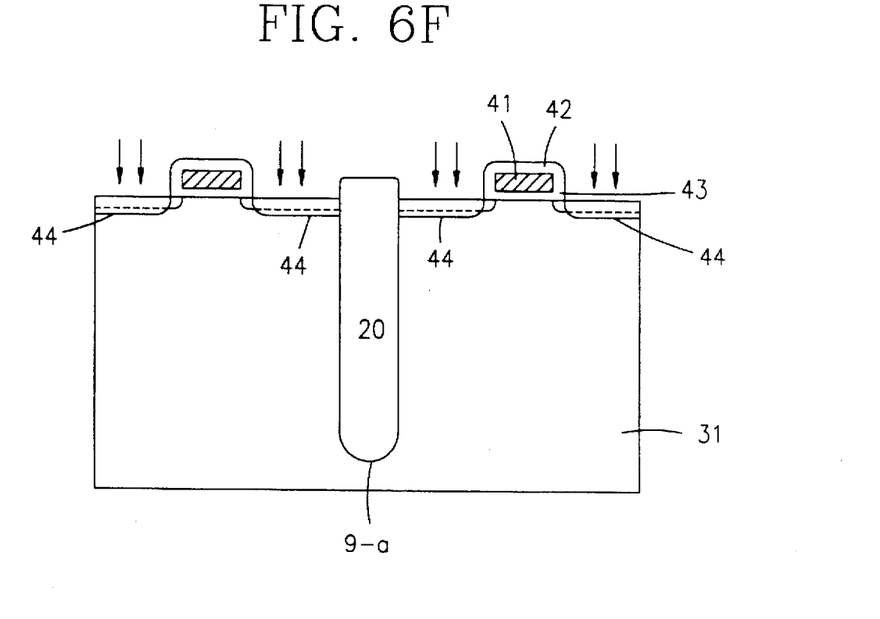

In the processes as shown in FIG. 6F, a predetermined region of the semiconductor substrate 31 is exposed through a blanket anisotropic dry etching process, and side wall spacers 43 are formed on the doped polysilicon gate electrode 41. Source/drain regions are formed in the exposed region of the semiconductor substrate 31 through an ion implantation process. In this embodiment of the present invention, since an NMOS mode is adapted, an $n^+$ diffusion region (namely, a doped region) 44 (the source/drain regions) is formed in the exposed region thereof.

Figure 6G:
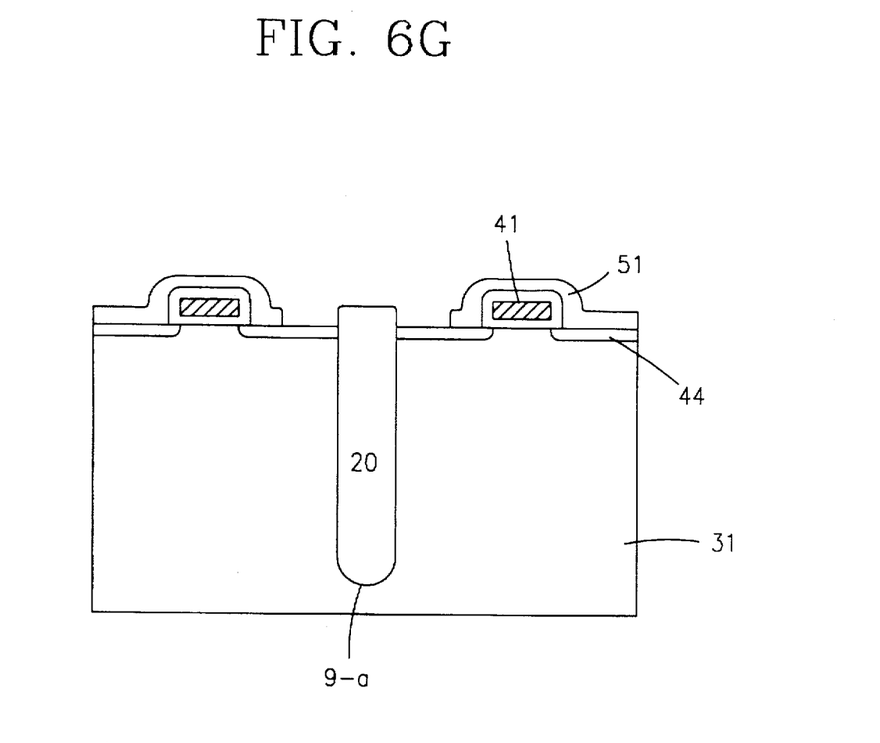

In the processes as shown in FIG. 6G, a third CVD oxide film 51 is formed on the semiconductor substrate 31 by a CVD process, and the first CVD oxide film 20 is defined through a photolithography process, and the CVD oxide film 51 is etched in order to expose an open region of the semiconductor substrate 31. Here, the open region of the semiconductor substrate 31 becomes second and third trench regions.

Figure 6H:
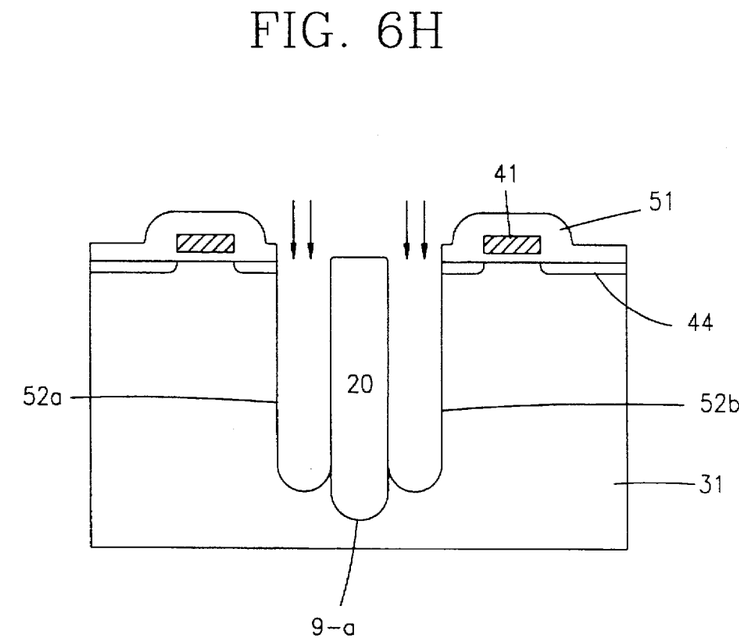

In the processes as shown in FIG. 6H, second and third trenches 52a and 52b are formed by vertically and downwardly etching the semiconductor substrate 31 to a predetermined depth. Preferably, the second and third trenches 52a and 52b formed by the trench-etching process contacts with the first trench 9-a, and the depth of the second third trenches 52a and 52b do not exceed the depth of the first trench 9-a.

Figure 6I:
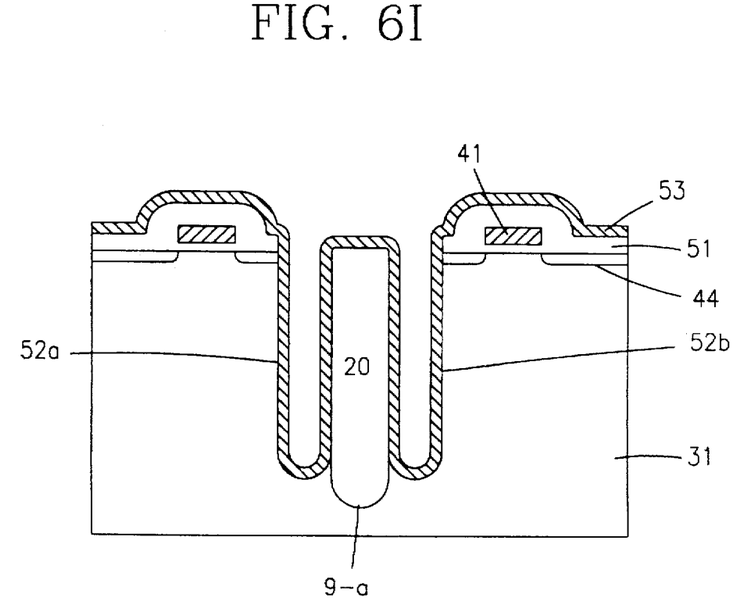

In the processes as shown in FIG. 6I, a polysilicon layer 53 which acts as a capacitor plate electrode (a first electrode) is formed on the semiconductor substrate 31 by a CVD process. The polysilicon layer 53 is a polysilicon or an amorphous silicon in which Boron is doped. Here, $SiH_4$ or $Si_2H_6$ is used as a source of the silicon, and $B_2H_6$ is used as a source of the Boron. The polysilicon layer 53 is formed to a thickness of about 50–500 nm and is doped by an in-situ doping process.

Figure 6J:
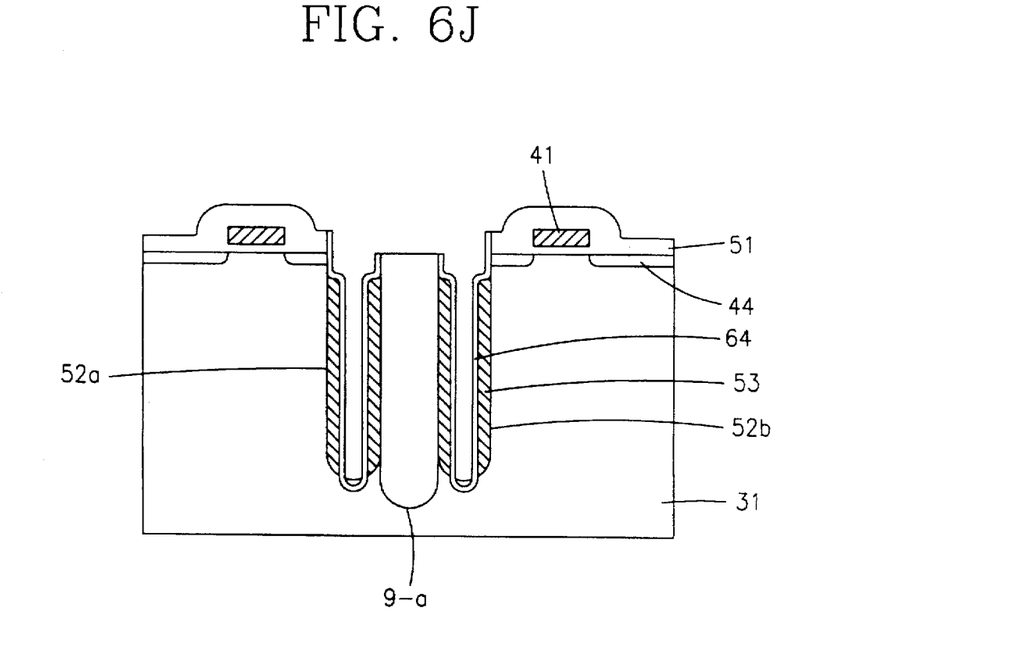

In the processes as shown in FIG. 6J, all of the boron-doped polysilicon layer 53 is removed through an anisotropic dry etching process except the portions formed on the inner walls of the second and third trenches 52a and 52b, and then a thin dielectric layer 64 is formed on the semiconductor substrate 31 including the second and third trenches 52a and 52b, and then the dielectric thin film 64 is removed except the portion formed on the polysilicon layer 53 of the second and third trenches 52a and 52b.

Figure 6K:
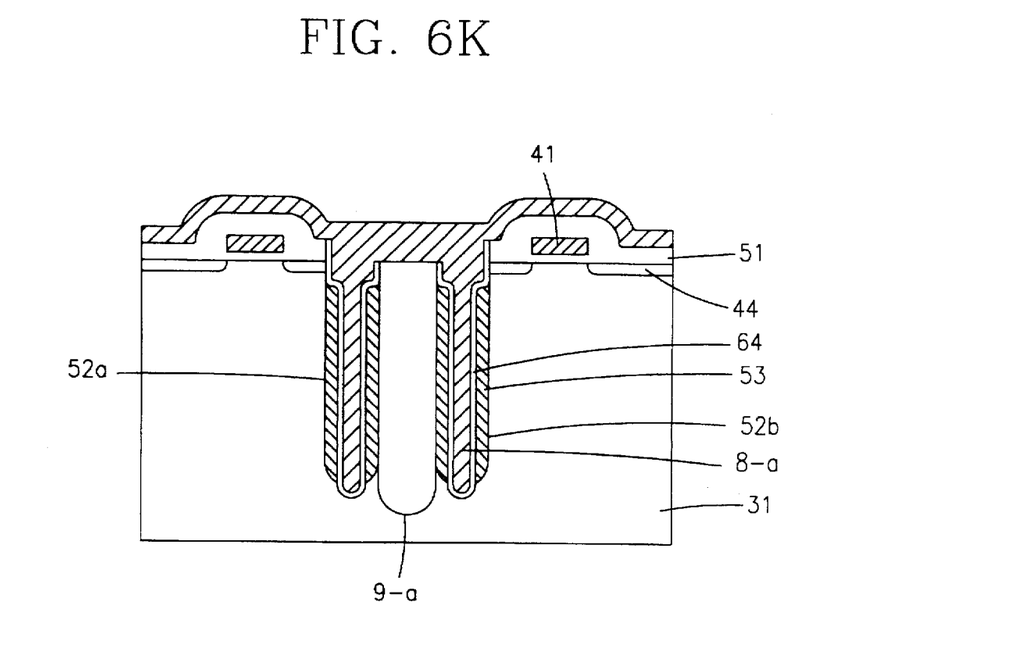

In the processes as shown in FIG. 6K, a silicon layer 8-a which is an n-type (for example, a Phosphorus) doped silicon layer is deposited on the semiconductor substrate 31 including the second and third trenches as a storage electrode (a second electrode) of the capacitor, so that the second and third trenches 52a and 52b are filled thereby.

Figure 6L:
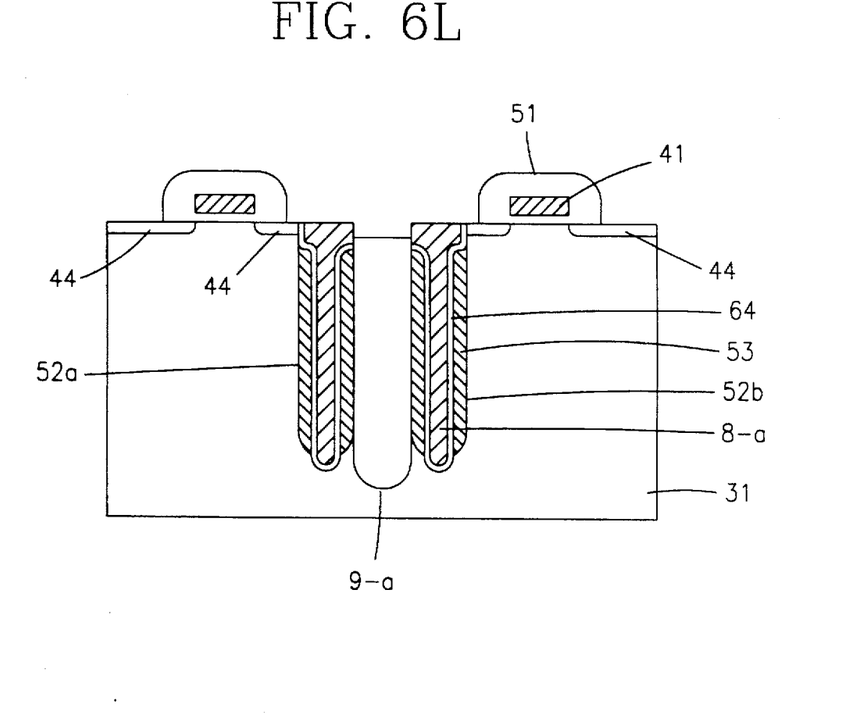

In the processes as shown in FIG. 6L, the n-type doped silicon layer 8-a is removed by a blanket etching method except the region formed in the upper portion of the second and third trenches 52l and 52b. Next, the $n^+$ diffusion region 44 formed on the semiconductor substrate 31 is exposed by blanket-etching the third CVD oxide film 51.

Figure 6M:
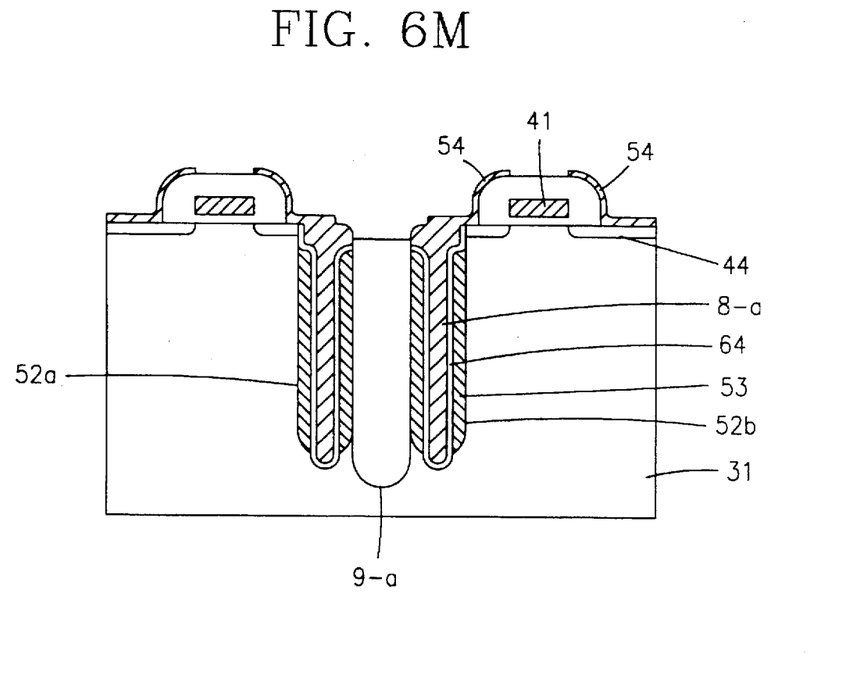

In the processes as shown in FIG. 6M, an n-type doped polysilicon layer 54 is deposited on the semiconductor substrate 31 by a CVD process and is defined through a photolithography process. The $n^+$ diffusion region 44 in which a bit line is to be formed is covered, and the n-type silicon layer 8-a and the $n^+$ diffusion region 44 are electrically connected together. Preferably, the n-type doped polysilicon 54 is deposited to a thickness of about 50–500 nm.

Figure 6N:
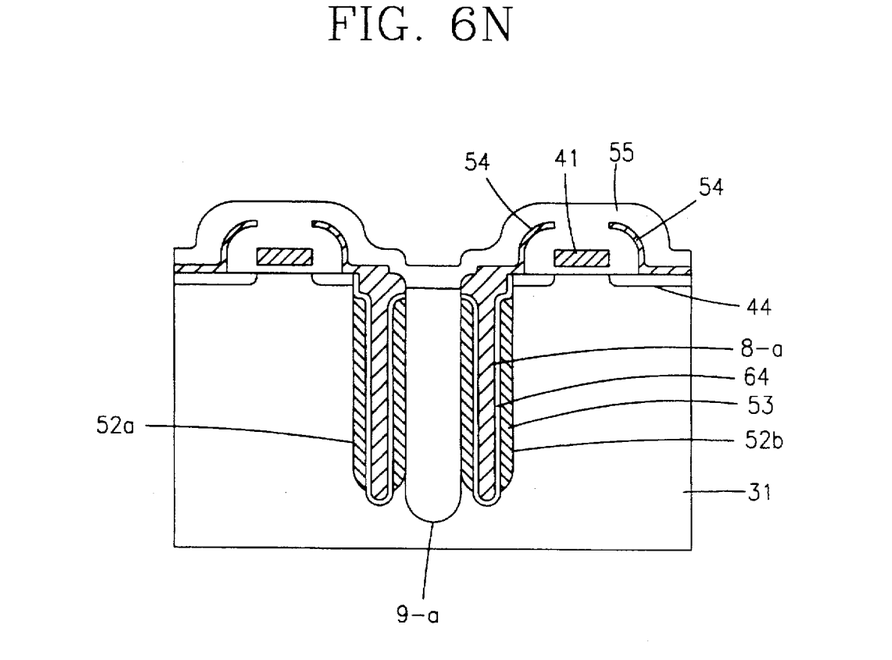

In the processes as shown in FIG. 6N, an interlayer dielectric layer 55 is formed on the semiconductor substrate 31. The interlayer dielectric layer 55 may be either an undoped silicate glass (USG), or a phosphor-silicate glass (PSG), or a borophospho-silicate glass (BPSG).

Figure 6O:
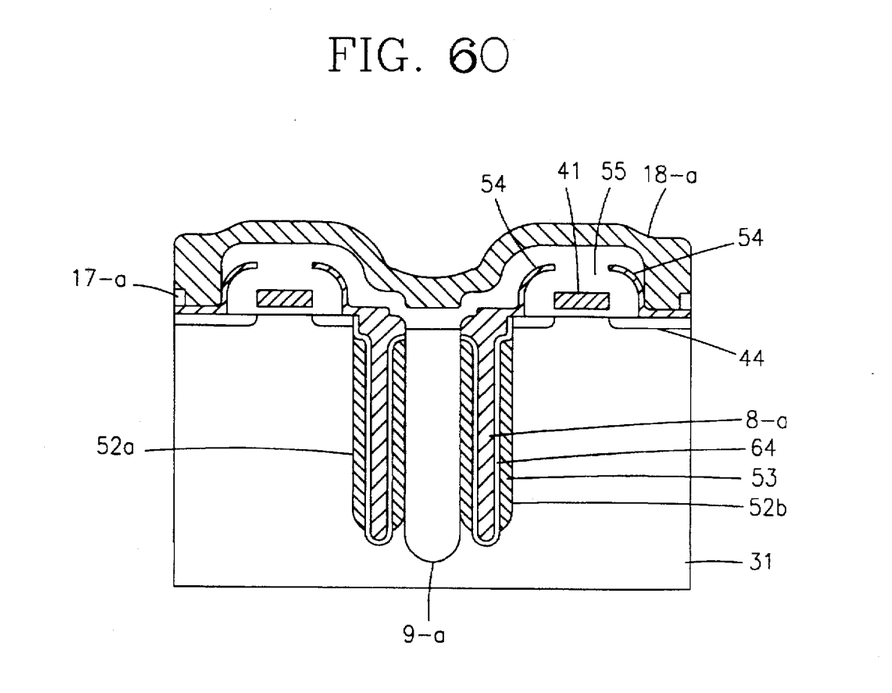

In the processes as shown in FIG. 6O, contact regions are defined on predetermined regions of the interlayer dielectric layer 55 through a photolithography process, and a bit line 18-a is formed by depositing and patterning a conductive material on the interlayer dielectric layer 55 through a metallization process.

As described above, the method for fabricating a capacitor of a semiconductor device according to the present invention is directed to preventing error caused by an interaction between neighboring second and third trench capacitors by forming an isolated trench as a first trench in the trench isolation region so that an electric isolation can be achieved between neighboring deep trenches.

In addition, it is possible to reduce soft errors caused by α-particles by changing the positions of the storage node and the plate. In addition, a current leakage path is removed by forming the boron doped polysilicon layer 53 (the plate of the trench capacitor) in the semiconductor substrate, and since the present invention is directed to a trench capacitor structure, it is easy to secure an areal/topographic fabrication margin.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for fabricating a capacitor of a semiconductor device, comprising:

forming a first trench in a semiconductor substrate;

filling the first trench with an insulation film;

etching the semiconductor substrate at both sides of the first trench for forming second and third trenches;

forming a first electrode at both sides of the second and third trenches, respectively;

forming a dielectric film contacting the first electrode and the second and third trenches; and forming a second electrode of the capacitor on the dielectric film.

2. The method of claim 1, wherein said insulation film filling step comprises forming an insulation film on the semiconductor substrate including the first trench, and etching-back the insulation film while leaving the insulation film filled in the first trench.

3. The method of claim 1, wherein said insulation film is an oxide film.

4. The method of claim 3, wherein said oxide film is formed of one of a CVD oxide film and an SOG.

5. The method of claim 1, wherein-said second and third trenches contact with the first trench, and depths of the second and third trenches are shallower than that of the first trench.

6. The method of claim 1, wherein said first and second electrodes include a polycrystal line silicon.

7. The method of claim 6, wherein said polycrystal line silicon of the first electrode is doped with a P-type dopant, and said polycrystal line silicon of the second electrode of the capacitor is doped with an n-type dopant.

8. The method of claim 7, wherein said P-type dopant is Boron, and said N-type dopant is Phosphorus.

9. A method for fabricating a capacitor of a semiconductor device, comprising:

forming a first trench in a semiconductor substrate;

filling an insulation film in the first trench;

forming a gate electrode on the semiconductor substrate at both sides of the first trench;

forming impurity region in the semiconductor substrate at both sides of the gate electrode;

etching the impurity region for forming second and third trenches at both sides of the first trench;

forming a first electrode on both sides of the second and third trenches;

forming a dielectric film on the first electrode and forming a second electrode on the dielectric film; and forming a conductive layer on the second electrode and on the impurity region neighboring the second and third trenches.

10. The method of claim 9, further comprising:

forming a second insulation film on the semiconductor substrate including the gate electrode after forming the gate electrode;

etching impurity region neighboring the first trench; and forming the second and third trenches by etching the semiconductor substrate using the second insulation film and the insulation film filled in the first trench as a mask.

* * * * *